(12) United States Patent
Deaton et al.

(10) Patent No.: US 7,767,316 B2
(45) Date of Patent: *Aug. 3, 2010

(54) ORGANIC ELECTROLUMINESCENT DEVICES AND COMPOSITION

(75) Inventors: Joseph C. Deaton, Rochester, NY (US); Christopher T. Brown, Rochester, NY (US); David W. Place, Webster, NY (US); Marina E. Kondakova, Kendall, NY (US); Shouquan Huo, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 1152 days.

This patent is subject to a terminal disclaimer.

(21) Appl. No.: 11/015,929

(22) Filed: Dec. 17, 2004

(65) Prior Publication Data

US 2006/0063030 A1 Mar. 23, 2006

Related U.S. Application Data

(63) Continuation-in-part of application No. 10/945,338, filed on Sep. 20, 2004, now abandoned.

(51) Int. Cl.
*H01L 51/50* (2006.01)
(52) U.S. Cl. .................. 428/690; 428/412; 428/917; 313/504; 313/506
(58) Field of Classification Search ................ 428/690, 428/917, 212; 313/504, 506; 257/E51.051, 257/E51.049; 252/301.16
See application file for complete search history.

(56) References Cited

U.S. PATENT DOCUMENTS

| 5,141,671 | A | * | 8/1992 | Bryan et al. ........... 252/301.16 |
| 6,392,250 | B1 | | 5/2002 | Aziz et al. |
| 6,573,651 | B2 | * | 6/2003 | Adachi et al. ............... 313/504 |
| 6,602,618 | B2 | | 8/2003 | Watanabe et al. |
| 6,893,743 | B2 | * | 5/2005 | Sato et al. .................... 428/690 |
| 7,147,935 | B2 | * | 12/2006 | Kamatani et al. ........... 428/690 |
| 2001/0019782 | A1 | * | 9/2001 | Igarashi et al. .............. 428/690 |
| 2002/0086180 | A1 | | 7/2002 | Seo et al. |
| 2002/0101154 | A1 | | 8/2002 | Seo et al. |

(Continued)

FOREIGN PATENT DOCUMENTS

| EP | 1 398 363 | 3/2004 |
| EP | 1 578 172 | 9/2005 |
| WO | 03/083009 | 10/2003 |
| WO | 2004/034750 | 4/2004 |
| WO | 2004/060026 | 7/2004 |

OTHER PUBLICATIONS

J. C. Deaton, et al., "Synthesis for Organometallic Cyclometallated Transition Metal Complexes", U.S. Appl. No. 10/729,263, filed Dec. 5, 2003.

(Continued)

*Primary Examiner*—Dawn Garrett
(74) *Attorney, Agent, or Firm*—McKenna Long & Aldridge LLP

(57) ABSTRACT

An organic light emitting device contains a cathode, an anode, and has located there-between a light emitting layer, comprising co-hosts including a hole transporting compound and a particular aluminum chelate, together with at least one light emitting Iridium compound, wherein the Iridium compound is a tris C^N-cyclometallated complex with a triplet energy less than or equal to the triplet energy of each of the co-hosts.

48 Claims, 1 Drawing Sheet

U.S. PATENT DOCUMENTS

| | | |
|---|---|---|
| 2002/0105005 A1 | 8/2002 | Seo et al. |
| 2002/0109136 A1 | 8/2002 | Seo et al. |
| 2002/0121860 A1 | 9/2002 | Seo et al. |
| 2002/0135296 A1 | 9/2002 | Aziz et al. |
| 2002/0180347 A1* | 12/2002 | Adachi et al. ............... 313/503 |
| 2002/0182441 A1* | 12/2002 | Lamansky et al. .......... 428/690 |
| 2003/0072964 A1* | 4/2003 | Kwong et al. ............... 428/690 |
| 2003/0087125 A1 | 5/2003 | Aziz et al. |
| 2003/0104244 A1 | 6/2003 | Aziz et al. |
| 2003/0108770 A1 | 6/2003 | Hamada et al. |
| 2003/0129452 A1 | 7/2003 | Tsuji et al. |
| 2003/0134146 A1 | 7/2003 | Aziz et al. |
| 2003/0141809 A1 | 7/2003 | Furugori et al. |
| 2004/0033388 A1* | 2/2004 | Kim et al. ................... 428/690 |
| 2004/0241495 A1* | 12/2004 | Kwong et al. ............... 428/690 |
| 2005/0064235 A1* | 3/2005 | Liao et al. ................... 428/690 |
| 2005/0074629 A1* | 4/2005 | Forrest et al. ............... 428/690 |
| 2006/0257684 A1* | 11/2006 | Arakane et al. ............. 428/690 |
| 2007/0099026 A1 | 5/2007 | Lee et al. |

OTHER PUBLICATIONS

J. C. Deaton, "Synthesis of Organometallic Cyclometallated Group VIIIB Metal Complexes", U.S. Appl. No. 10/879,412, filed Jun. 29, 2004.

J. C. Deaton, "Sythesis of Organometallic Cyclometallated Transition Metal Complexes", U.S. Appl. No. 10/879,657, filed Jun. 29, 2004.

S. Huo, et al., "OLEDS with Mixed-Ligand Cyclometallated Complexes", U.S. Appl. No. 11/015,627, filed Dec. 17, 2004.

C. T. Brown, et al., "Organic Element for Electroluminescent Devices", U.S. Appl. No. 10/945,337, filed Sep. 20, 2004.

C. T. Brown, et al., "Organic Element for Electroluminescent Devices", U.S. Appl. No. 11/016,134, filed Dec. 17, 2004.

Y. Wu, et al., "Structural Effect of BAIqs on the EL Performance of Phosphorescent Organic Electroluminescent Devices", IDW, 2003, pp. 1343-1346.

C. Yang, et al., "Synthesis of a high-efficiency red phosphorescent emitter for organic light-emitting diodes", Journal of Materials Chemistry, 2004, pp. 947-950.

* cited by examiner

ORGANIC ELECTROLUMINESCENT DEVICES AND COMPOSITION

CROSS REFERENCE TO RELATED APPLICATION

This application is a Continuation-In-Part of U.S. Ser. No. 10/945,338, now abandoned, entitled Organic Electroluminescent Devices and Composition filed on Sep. 20, 2004, the contents of which are incorporated herein by reference.

FIELD OF THE INVENTION

This invention relates to an organic light emitting diode (OLED) electroluminescent (EL) device comprising a light-emitting layer containing an organometallic complex that can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often>100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, and therefore, it is referred to as the hole-transporting layer, and the other organic layer is specifically chosen to transport electrons, and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material, also known as the dopant. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

In organic electroluminescent devices, only 25% of electrons and holes recombine as singlet states while 75% recombine as triplet states according to simple spin statistics. Singlet and triplet states, and fluorescence, phosphorescence, and intersystem crossing are discussed in J. G. Calvert and J. N. Pitts, Jr., *Photochemistry* (Wiley, New York, 1966). Emission from triplet states is generally very weak for most organic compounds because the transition from triplet excited state to singlet ground state is spin-forbidden. Hence, many emitting materials that have been described as useful in an OLED device emit light from their excited singlet state by fluorescence and thereby utilize only 25% of the electron and hole recombinations. However, it is possible for compounds with states possessing a strong spin-orbit coupling interaction to emit strongly from triplet excited states to the singlet ground state (phosphorescence). One such strongly phosphorescent compound is fac-tris(2-phenyl-pyridinato-N^C-)Iridium(III) (Ir(ppy)$_3$) that emits green light (K. A. King, P. J. Spellane, and R. J. Watts, *J. Am. Chem. Soc.*, 107, 1431 (1985), M. G. Colombo, T. C. Brunold, T. Reidener, H. U. Güdel, M. Fortsch, and H.-B. Bürgi, *Inorg. Chem.*, 33, 545 (1994)). Organic electroluminescent devices having high efficiency have been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, *Appl. Phys. Lett.*, 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.*, 38, L1502 (1999)). Additional disclosures of phosphorescent materials and organic electroluminescent devices employing these materials are found in U.S. Pat. No. 6,303238 B1, WO 00/57676, WO 00/70655 and WO 01/41512 A1.

Aziz et al US 2003/0104242 A1 and US 2003/0134146 A1 disclose organic electroluminescent devices having an emissive layer containing the phosphorescent 2,3,7,8,12,13,17,18-octaethyl-21H,23H-porhine platinum(II) (PtOEP) dopant and about equal weight per cent of NPB and Alq as host materials. Kwong et al US 2002/0074935 A1 also disclose devices with an emissive layer containing the PtOEP dopant and equal proportions of NPB and Alq as host materials. Kwong et al additionally disclose a device with equal proportions of NPB and Alq, and a bis C^N-cyclometallated iridium complex, bis(benzothienyl-pyridinato-N^C)Iridium(III) (acetylacetonate) as phosphorescent dopant.

Bryan et al U.S. Pat. No. 5,141,671 disclose mixed-ligand aluminum chelate complexes having the property of blue emission for use in organic electroluminescent devices. Tsuji et al US 2003/0129452 A1 disclose the use of these blue-emissive aluminum chelate compounds as single host materials in red phosphorescent organic electroluminescent devices. Seo US 2002 0101154 A1 discloses an example of a device with a light emitting layer comprising a particular one of the blue-emissive aluminum chelates, bis(2-methyl-8-quinolinolato)(4-phenyl-phenolato)aluminum(III), and NPB and the PtOEP dopant in a composition of 80:20:4, respectively.

Notwithstanding all these developments, there remains a need to further improve efficiency, operational stability, or spectral characteristics of organic electroluminescent devices, as well as to reduce drive voltage of the devices.

SUMMARY OF THE INVENTION

The invention provides organic light emitting device containing a cathode, an anode, and having located there-between a light emitting layer, containing a composition comprising:
A) co-hosts including
   a) a hole transporting compound, and
   b) an aluminum chelate according to the formula (1)

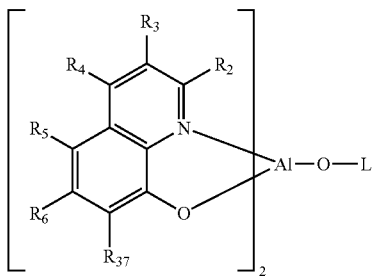

(1)

wherein:
$R_2$ represents an electron donating group,
$R_3$ and $R_4$ each independently represent hydrogen or an electron donating substituent,
$R_5$, $R_6$, and $R_7$ each independently represent hydrogen or an electron accepting group, and
L is an aromatic moiety linked to the aluminum by oxygen which may be substituted with substituent groups such that L has from 7 to 24 carbon atoms; and
B) at least one light emitting Iridium compound, wherein the Iridium compound is a tris C^N-cyclometallated complex with a triplet energy less than or equal to the triplet energy of each of the co-hosts. The invention also provides the described composition.

The invention provides devices that exhibit good luminance efficiency with low drive voltage and good operational lifetime.

DETAILED DESCRIPTION OF THE INVENTION

Figure 1:
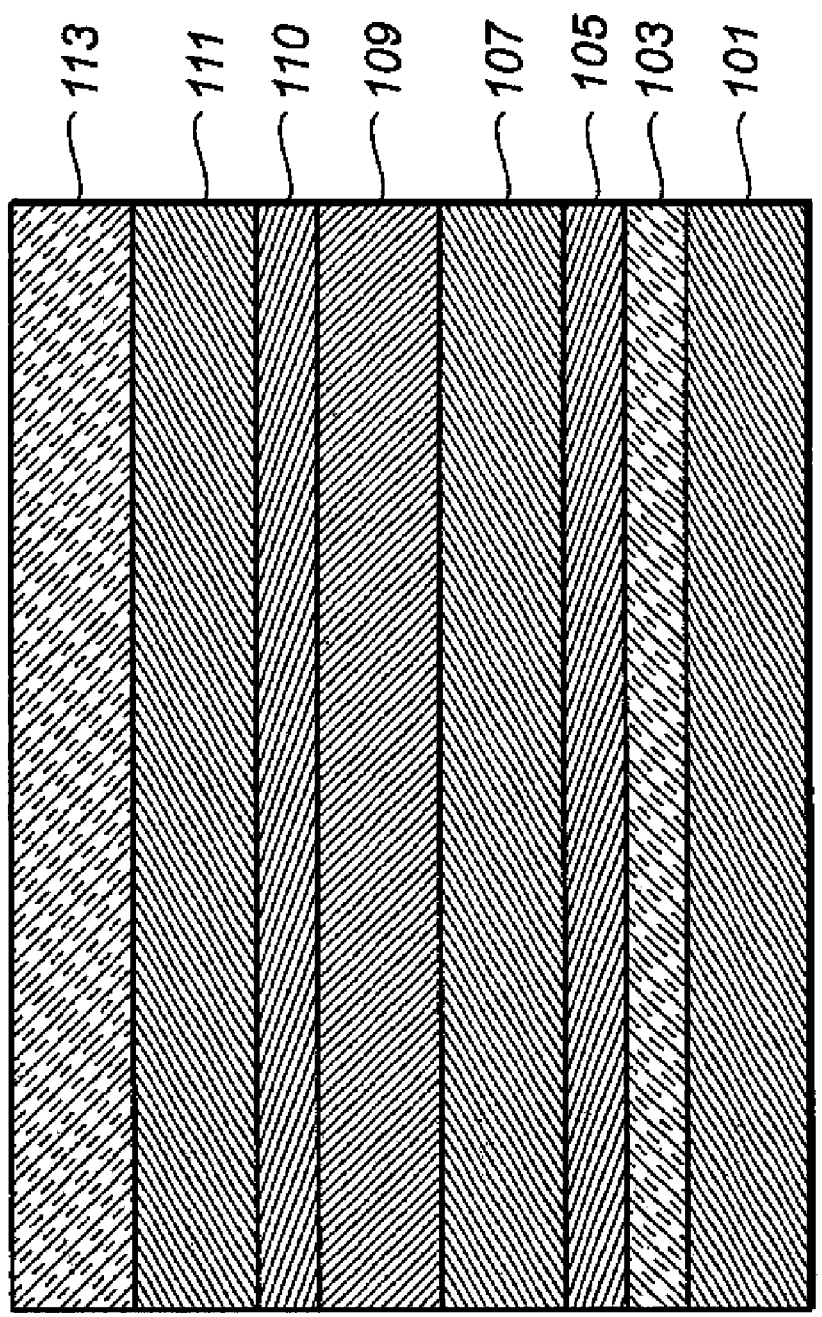
FIG. 1 shows a schematic cross-section of a typical OLED device in which this invention may be used.

The invention is generally described above.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups for the quinoline ring.

In formula (1), $R_2$ may be a suitable electron donating group selected from —R', —OR', and —NR'(R") where R' is a hydrocarbon containing up to 6 carbon atoms and R" is hydrogen or R'. Specific examples of $R_2$ include methyl, ethyl, phenyl, methoxy, ethoxy, phenoxy, $N(CH_3)_2$, —$N(CH_2CH_3)_2$, —$NHCH_3$, —$N(C_6H_5)_2$, —$N(CH_3)(C_6H_5)$, and —$NHC_6H_5$. One preferred group for $R_2$ is methyl. $R_3$ and $R_4$ may each independently be selected from the same groups as R2. Additionally, $R_3$ and $R_4$ may independently be hydrogen since an electron donating group at these positions is not required. One preferred group for $R_4$ is methyl. In another preferred embodiment, $R_2$ and $R_4$ are each methyl.

$R_5$, $R_6$, and $R_7$ may be an electron accepting group independently chosen from the group consisting of cyano, α-haloalkyl, α-haloalkoxy, amido, sulfonyl, carbonyl, carbonyloxy and oxycarbonyl substituents containing up to 10 carbon atoms. Specific example include —CN, —F, —$CF_3$, —$OCF_3$, —$CONHC_6H_5$, —$SO_2C_6H_5$, —$COC_6H_5$, —$CO_2C_6H_5$, and —$OCOC_6H_5$. Additionally, $R_5$, $R_6$, and $R_7$ may each independently be hydrogen since an electron accepting group at these positions is not required.

The group L may be any aromatic group, such as a phenyl group or a fused ring aromatic group, that may be unsubstituted or may be further substituted. The aromatic groups may be hydrocarbon or hetero-atom containing aromatics. Examples of hydrocarbon fused ring aromatics include α and β napthyl groups. (An α napthyl group results when substitution groups at ortho and meta positions on a phenyl group join to form a fused benzene ring, and a β napthyl group results when substitution groups at meta and para positions on a phenyl group join to form a fused benzene ring.)

The substitution groups on the group L may be selected from aliphatic hydrocarbons or α-halohydrocarbons, phenyl groups or fused ring aromatic groups. The aliphatic hydrocarbons may contain from 1 to 10 carbon atoms, but preferably contain 1 to 3 carbon atoms. In a preferred embodiment the aliphatic substitution group is methyl. The α-halohydrocarbons may contain from 1 to 10 carbon atoms, but preferably contain 1 to 3 carbon atoms. In another preferred embodiment, the α-halohydrocarbon substitution group is trifluoromethyl.

These aluminum bis-(2-substituted)oxinoid compounds bearing a third ligand comprising an aromatic-oxy group (Formula 1) possess the property of fluorescent light-emission (i.e. from singlet excited states) that is blue-shifted relative to other aluminum oxinoid compounds such as tris(8-quinolinolato)aluminum(III) (Alq). These aluminum bis-(2-substituted)oxinoid compounds bearing a third ligand comprising an aromatic-oxy group also provide a higher triplet energy than other aluminum oxinoid compounds such as Alq, thereby providing higher luminous efficiency when employed in conjunction with phosphorescent dopants emitting from a triplet excited state as in the present invention, especially when the oxinoid compound is selected to have a triplet energy higher than that of the phosphorescent dopant. These aluminum oxinoid materials possess electron-transporting property for the host mixture. Excellent operational lifetime of the devices can be obtained with these materials. These aluminum bis-(2-substituted)oxinoid compounds bearing a third ligand comprising an aromatic-oxy group employed in the present invention also provide a higher ionization potential than other aluminum oxinoid compounds such as Alq, thus making it more difficult for holes to escape the emissive layer, especially when an undoped layer is placed between the emissive layer and the cathode or any additional electron transporting materials. The aluminum oxinoid compounds employed in the present invention may be made according to procedures found in Bryan et al U.S. Pat. No. 5,141,671. Examples of the compounds are shown below.

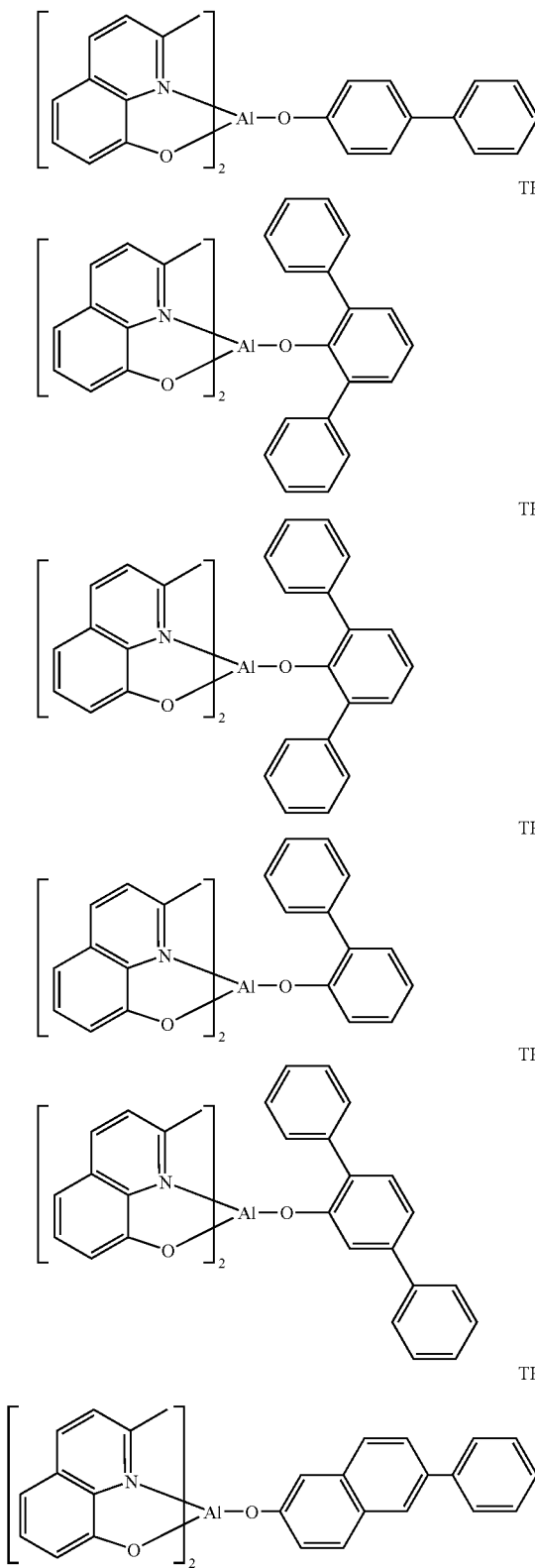

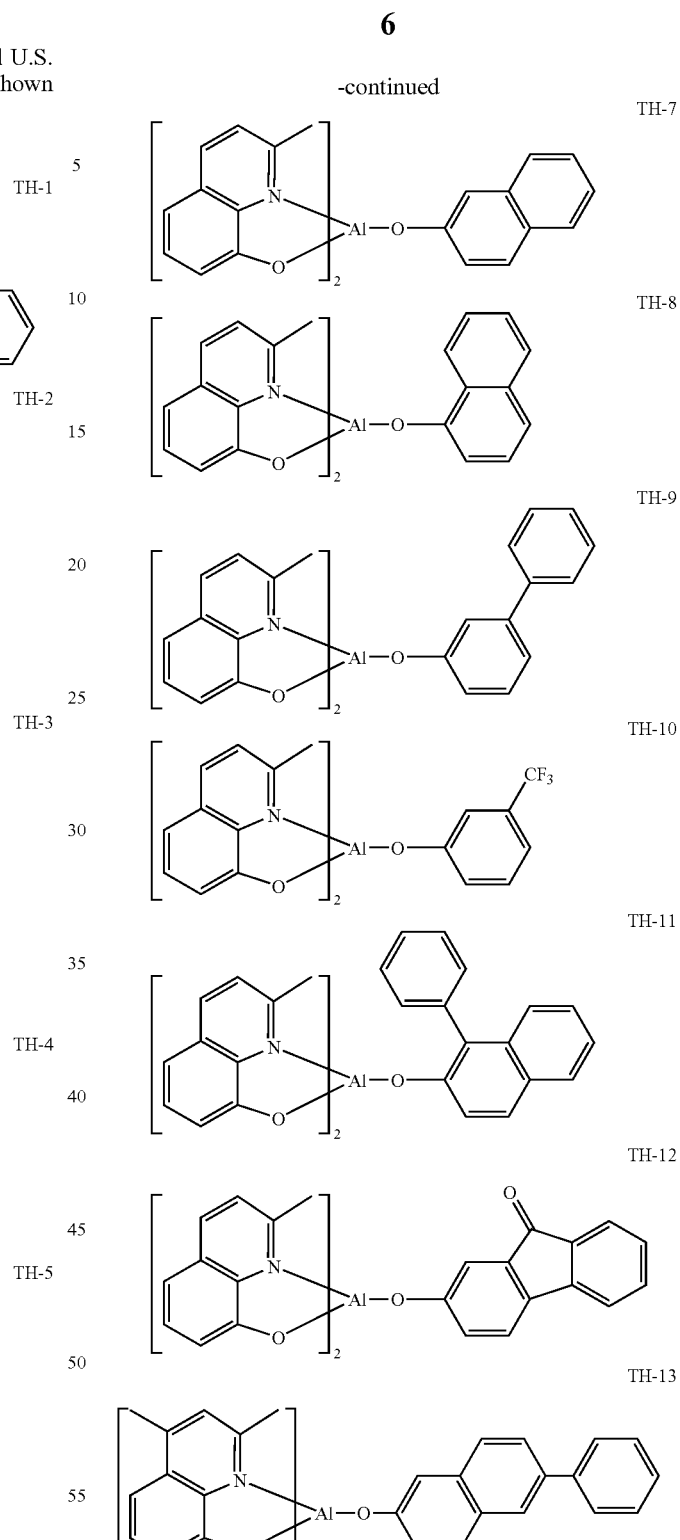

The co-host having hole transporting property may be any suitable hole transporting compound, such as triarylamines or carbazoles, as long it has a triplet energy that is higher than that of the phosphorescent dopant to be employed. The optimum concentration of the hole transporting co-host relative to the electron transporting co-host in the present invention may be determined by experimentation and may be within the range 10 to 60% by weight relative to the aluminum compound co-host, and is often found to be in the range 10 to 30%.

A suitable class of hole-transporting compounds for use as co-host in the present invention are the aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

$$Q_1\text{---}G\text{---}Q_2 \qquad A$$

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

$$R_1\text{---}\underset{\underset{R_4}{|}}{\overset{\overset{R_2}{|}}{C}}\text{---}R_3 \qquad B$$

where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

$$\underset{R_6}{\overset{R_5}{\diagdown}}N\text{---} \qquad C$$

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

$$\underset{Ar}{\overset{R_7}{\diagdown}}N\text{---}(Are)_n\text{---}N\underset{R_9}{\overset{R_8}{\diagup}} \qquad D$$

wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting co-host can be formed of a single aromatic tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-tolyl)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene N,N,N',N'-Tetra(2-naphthyl)-4,4"-diamino-p-terphenyl 4,4'-Bis{N-phenyl-N-[4-(1-naphthyl)-phenyl] amino}biphenyl 2,6-Bis[N,N-di(2-naphthyl)amino]fluorene 4,4',4"-tris[(3-methylphenyl)phenylamino]triphenylamine (MTDATA)

4,4'-Bis[N-(3-methylphenyl)-N-phenylamino]biphenyl (TPD)

Another class of useful hole-transporting materials that may be used as co-host includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Another class of useful hole-transporting materials that may be used as co-host in the present invention includes the carbazoles, for example, poly(N-vinylcarbazole), 4,4'-bis(carbazol-9-yl)biphenyl (CBP), 4,4'-bis(carbazol-9-yl)-2,2'-dimethyl-biphenyl (CDBP), 1,3-bis(carbazol-9-yl)benzene (mCP), 4,4',4"-Tris(carbazol-9-yl)triphenylamine (TCTA).

The phosphorescent dopant is selected in the present invention to be a tris-C^N-cyclometallated Iridium complex. Here the term "C^N-cyclometallated" (alternatively written "C,N-cyclometallated") describes bidentate ligands that bond to the central metal atom (i.e., Iridium) through a metal-carbon bond and through coordination to a nitrogen atom. The compounds having three C^N-cyclometallating ligands provide higher device operational stability than compounds having only two C^N-cyclometallating ligands and the remaining coordinating sites occupied by other types of ancillary ligands, such as acetylacetonate or a Schiff base such as the deprotonated from of picolinic acid. The tris-C^N-cyclometallated Iridium complexes may be facial or meridional isomers. The facial isomers are usually preferred since they are often found to have higher emission quantum yield than meridional isomers. One example of a tris-C^N-cyclometallated Iridium complex is tris(2-phenyl-pyridinato-N^C-)Iridium(III), shown below in stereodiagrams as facial (fac-) or meridional (mer-) isomers.

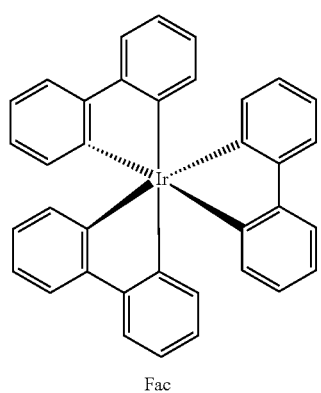

Fac

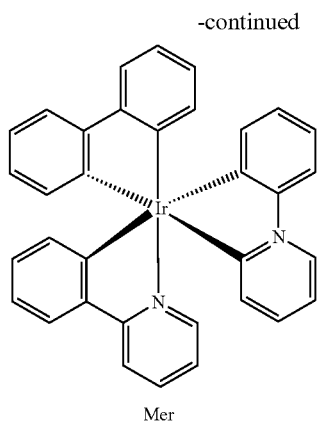

Mer

Further examples of tris-C^N-cyclometallated Iridium complexes are shown below.

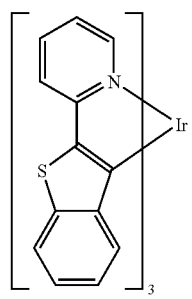

2a

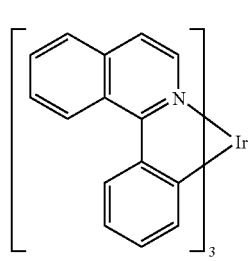

2b

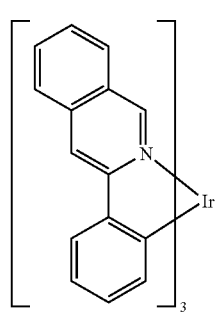

2c

-continued
2d
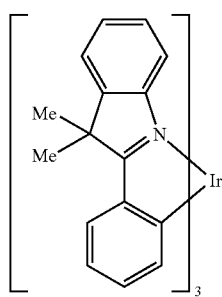
2e
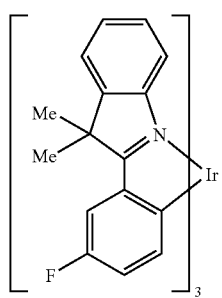
2f
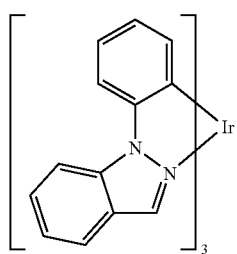
2g
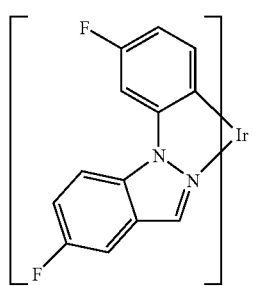
2h
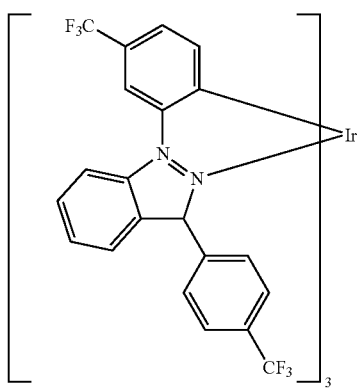
-continued
2i
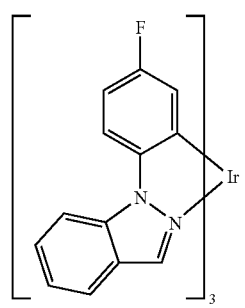
2j
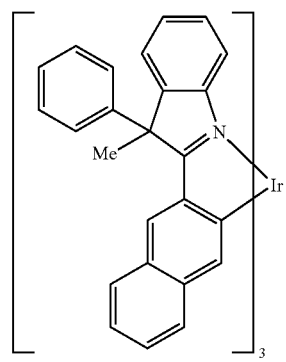
2k
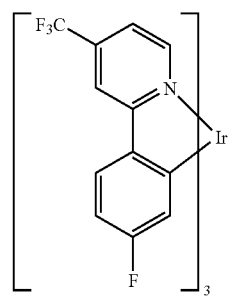
2l
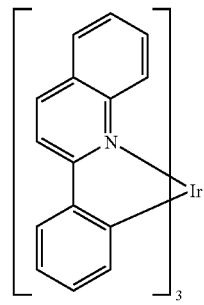
2m
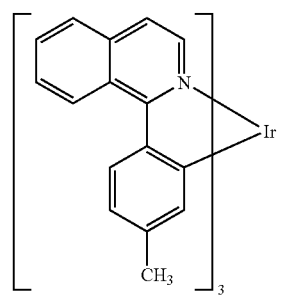

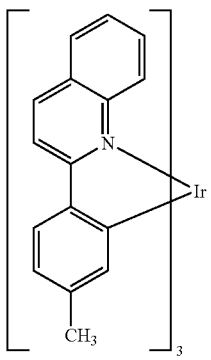

Tris-C^N-, or synonymously C,N-, cyclometallated Iridium compounds may also include compounds in which the three C^N-cyclometallating ligands are not all the same. Examples include bis(1-phenylisoquinolinato-N^C-)(2-phenylpyridinato-N^C-)Iridium(III), bis(2-phenylpyridinato-N^C-)(1-phenylisoquinolinato-N^C-)Iridium(III), bis(1-phenylisoquinolinato-N^C-)(2-phenyl-5-methyl-pyridinato-N^C-)Iridium(III), bis(1-phenylisoquinolinato-N^C-)(2-phenyl-4-methyl-pyridinato-N^C-)Iridium(III), and bis(1-phenylisoquinolinato-N^C-)(2-phenyl-3-methyl-pyridinato-N^C-)Iridium(III).

The tris-C^N-cyclometallated Iridium complexes employed in the present invention may be synthesized according to literature methods or by reacting an iridium halide complex with a silver salt and excess organic cyclometallating ligand in a diol solvent or by the methods disclosed in U.S. Ser. No. 10/729,207 or in pending applications U.S. Ser. Nos. 10/729,263, and 10/879,412, and 10/879,657 and references therein. Additional examples of tris-C^N-cyclometallated compounds may be found within these same references and references therein, incorporated herein in their entirety. Particularly useful ligands for the tris-C^N-cyclometallated Iridium complexes of the present invention are substituted or unsubstituted 2-phenyl quinolines, 1-phenyl isoquinolines, and 3-phenyl isoquinolines. Synthesis of tris-C, N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (Bull. Chem. Soc. Jpn., 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C, N-cyclometallated complex containing the two different C,N-cyclometallating ligands may be converted to an isomer wherein the C atoms bonded to the metal (e.g. Ir) are all mutually cis by heating in a suitable solvent such as dimethyl sulfoxide.

The tris-C^N-cyclometallated iridium complexes give superior performance over alternative groups of phosphorescent dopants including platinum porphyrin complexes, such as 2,3,7,8,12,13,17,18-octaethyl-21H,23H-porhine platinum (II), and platinum C^N-cyclometallated complexes since the platinum complexes exhibit a strong tendency to interact with each other or to aggregate as a function of concentration in the host material, leading to variable emissive properties. The tris-C^N-cyclometallated iridium complexes also generally provide superior quantum yields for emission and short emission lifetimes.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl; methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

As stated earlier, it is well within the skill of the art to determine whether a particular group is electron donating or electron accepting. The most common measure of electron donating and accepting properties is in terms of Hammett $\sigma$ values. Lange's handbook of Chemistry, $12^{th}$ Ed., McGraw Hill, 1979, Table 3-12, pp. 3-134 to 3-138 lists Hammett $\sigma$ values for a large number of commonly encountered groups. Hammett $\sigma$ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

In many known hosts and device architectures for phosphorescent OLEDs, the optimum concentration of the phosphorescent dopant for luminous efficiency is found to be about 6 to 8 vol % relative to the host material. Surprisingly, in the device architecture with the mixed hosts of the present invention it is found that dopant concentrations from about 0.5% to about 5% provide high luminous efficiencies.

General Device Architecture

The present invention can be employed in many OLED device configurations using small molecule materials, oligomeric materials, polymeric materials, or combinations thereof. These range from very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in FIG. 1 and is comprised of a substrate 101, an anode 103, a hole-injecting layer 105, a hole-transporting layer 107, a light-emitting layer 109, an exciton or a hole blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element from the cathode. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

This invention may be used in so-called stacked device architecture, for example, as taught in U.S. Pat. No. 5,703,436 and U.S. Pat. No. 6,337,492.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials, such as silicon, ceramics, and circuit board materials. Again, the substrate can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or a salt of a low work function metal, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole Transporting Layer.

In addition to the emissive layer, it is usually advantageous to have a hole transporting layer deposited between the anode and the emissive layer. A hole transporting material deposited in said hole transporting layer between the anode and the light emitting layer may be the same or different from a hole transporting compound used as co-host according to the invention. The hole transporting layer may optionally include a hole injection layer. The hole transporting layer may include more than one hole transporting compound, deposited as a blend or divided into separate layers.

The hole-transporting layer of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, di aryl amine, triarylamine, or a polymeric aryl amine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (A).

A

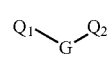

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

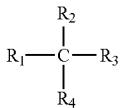

B where

R$_1$ and R$_2$ each independently represents a hydrogen atom, an aryl group, or an alkyl group or R$_1$ and R$_2$ together represent the atoms completing a cycloalkyl group; and R$_3$ and R$_4$ each independently represents an aryl group, which is in turn substituted with a diaryl substituted amino group, as indicated by structural formula (C):

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

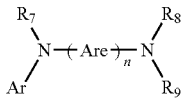

D wherein each Are is an independently selected arylene group, such as a phenylene or anthracene moiety, n is an integer of from 1 to 4, and Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single aromatic tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-tolyl)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
5 4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

It is also possible for the hole-transporting layer to comprise two or more sublayers of differing compositions.

The thickness of the hole-transporting layer can be between 10 and about 500 nm and suitably between 50 and 300 nm.

Hole Injecting Layer

A hole-injecting layer may be provided between anode and hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4''-tris[(3-methylphenyl)phenylamino]triphenylamine).

Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 to 200 and suitably in the range of 0.3 to 1.5 nm.

Electron Transporting Layer

Similarly, it is usually advantageous to have an electron transporting layer deposited between the cathode and the emissive layer. The co-host in the emissive layer having electron transporting property may be the same or different from an electron transporting material deposited in said electron transporting layer between the anode and the light emitting layer. The electron transporting layer may include more than one electron transporting compound, deposited as a blend or divided into separate layers.

Preferred thin film-forming materials for use in constructing the electron-transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (E) below.

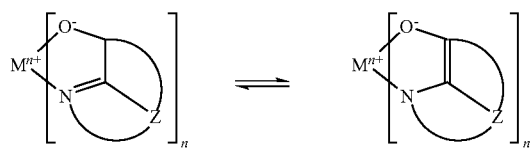

E wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)]

Other electron transporting materials suitable for use in the electron transporting layer are the aluminum complexes described by Formula 1 above, which are also the compounds employed as co-hosts in the present invention.

Other electron-transporting materials suitable for use in the electron-transporting layer include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines and oxadiazoles are also known to be useful as electron transporting materials.

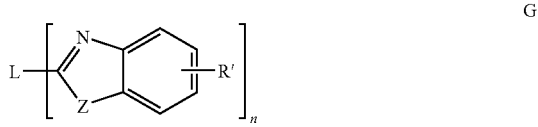

G

Where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together. An example of a useful benzazole is 2, 2',2"-(1,3,5-phenylene)tris[1-phenyl-1H-benzimidazole] (TPBI) shown below and disclosed in Shi et al U.S. Pat. No. 5,766,779.

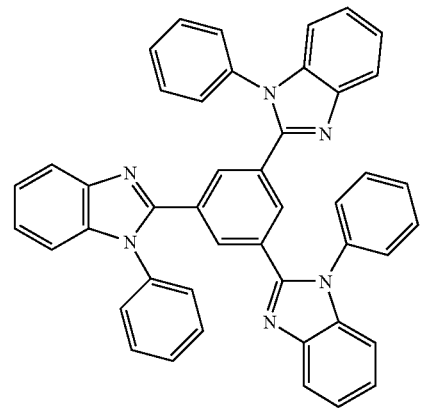

The electron transporting layer or a portion of the electron transporting layer adjacent the cathode may further be doped with an alkali metal to reduce electron injection barriers and hence lower the drive voltage of the device. Suitable alkali metals for this purpose include lithium and cesium.

If both a hole-blocking layer and an electron-transporting layer are used, electrons should pass readily from the electron-transporting layer into the hole-blocking layer. Therefore, the electron affinity of the electron-transporting layer should not greatly exceed that of the hole-blocking layer. Preferably, the electron affinity of the electron-transporting layer should be less than that of the hole-blocking layer or not exceed it by more than about 0.2 eV.

If an electron-transporting layer is used, its thickness may be between 2 and 100 nm and preferably between 5 and 50 nm.

Blocking Layers

In addition to suitable co-hosts and transporting materials, an OLED device according to the invention may also include at least one hole or electron blocking layers and/or exciton blocking layers to help confine the excitons or electron-hole recombination centers to the light-emitting layer comprising the co-hosts and phosphorescent material. In one embodiment, such a blocking layer would be placed between the electron-transporting layer and the light-emitting layer. In this case, the ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(III) (BAlQ). Additional aluminum complexes represented by Formula 1 above may also serve as useful blocking layers between the electron transporting layer and the light emitting layer. Other metal complexes useful as blocking layers are described in US 20030068528. US 20030175553 A1 describes the use of fac-tris(1-phenylpyrazolato-N,C 2)iridium(III) (Irppz) in an electron/exciton blocking layer deposited between the hole transporting layer and the light emitting layer. When a blocking layer is used, its thickness can be between 2 and 100 nm and preferably between 5 and 10 nm.

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, coating from a solvent is usually preferred. The material to be deposited by sublimation can be vaporized from a sublimator "boat" often comprised of a tantalum material, e.g., as described in U.S. Pat. No. 6,237, 529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294, 870), spatially-defined thermal dye transfer from a donor sheet (U.S. Pat. No. 5,688,551, U.S. Pat. No. 5,851,709 and U.S. Pat. No. 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as Silicon oxide, Teflon, and alternating inorganic/polymeric layers are known in the art for encapsulation. Any of these methods of sealing or encapsulation and desiccation can be used with the OLEDs constructed according to the present invention.

Optical Optimization

OLED devices of this invention can employ various well-known optical effects in order to enhance their emissive properties if desired. Included are optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

EXAMPLES

Example

Determination of Triplet Energies

Normally, the fluorescence emission from singlet excited state dominates the emission spectra of aluminum oxinoid compounds at room temperature. However, the phosphorescence emission spectrum from the triplet excited state may be time-resolved from the fluorescence spectrum by the delayed luminescence technique since the fluorescence lifetimes are usually on the order of 1 to 10 nsec, while phosphorescence lifetimes are considerably longer. The phosphorescent emission is usually very low in quantum yield, and is best observed at low temperatures with very sensitive detection.

The energy of the triplet state of each compound, relative to the ground state, was evaluated by inspection of a phosphorescence spectrum obtained in a low-temperature glass-forming solvent. The method is well established and will be illustrated with reference to Alq. A solution containing approximately 0.05% Alq, 20% iodobenzene, 40% dichloromethane, and 40% toluene was placed in an ultraviolet-transparent 5-mm glass tube and immersed in liquid nitrogen to form a low-temperature glass. The tube and liquid nitrogen were contained within a Dewar flask fitted with flat windows suitable for spectroscopic measurements. A He/Cd laser operating continuously at 325 nm was used with a mechanical chopper to illuminate the sample repeatedly with 2 ms pulses followed by 2 ms in the dark. Luminescence from the solution was detected using a grating monochromator, photomultiplier tube, and gated photon counter. A trigger signal from the chopper was used to gate the photon counter such that counting began 200 microseconds after the end of each 325 nm pulse and ceased before the onset of the next pulse. The output of the photon counter was averaged and recorded as a function of emission wavelength using a computer. The result was a spectrum of the phosphorescence of Alq. A characteristic wavelength was identified as the shortest wavelength at which the intensity of the phosphorescence equaled one-half of its maximum value. This wavelength was converted to photon energy by dividing it into the quantity h c, where h is Planck's constant ($6.625 \times 10^{-34}$ J s) and c is the speed of light ($2.998 \times 10^8$ m s$^{-1}$). This photon energy was identified as the characteristic energy of the triplet state of Alq relative to the ground state. The table below contains the triplet energies determined for a number of aluminum oxinoid complexes by the delayed luminescence technique at 77 K.

TABLE 1

| Compound | Eg(T), eV |
|---|---|
| TH-1 | 2.36 |
| TH-2 | 2.37 |
| TH-3 | 2.46 |
| TH-4 | 2.36 |
| TH-5 | 2.46 |
| TH-6 | 2.36 |
| Alq | 2.19 |

From Table 1, it is seen that the aluminum bis-(2-substituted)oxinoid compounds bearing a third ligand comprising an aromatic-oxy group possess higher triplet energies than Alq. Furthermore, it is seen that selecting the 2-substituted oxinoid ligand and the aromatic-oxy group as in Compounds TH-3 and TH-5 can provide still higher triplet energies than those of the other compounds.

Example 1

These samples employ the tris C^N-cyclometallated Iridium compound, fac-tris(1-phenyl-isoquinolinato-N^C)Iridium(III) (Ir(1-piq)$_3$, compound 2b), and the bis C^N-cyclometallated dopant, bis(1-phenyl-isoquinolinato-N^C)Iridium(III)(acetylacetonate) (Ir(1-piq)$_2$(acac)), each having a triplet energy of about 2.08 eV estimated from emission spectra obtained at room temperature from a film of polymethylmethacrylate doped with the compound.

Sample 1-1: An OLED was vapor deposited on a glass substrate to have the following structure of layers: ITO/NPB (75 nm)/Alq+8% Ir(1-piq)$_3$/Alq (40 nm)/MgAg (220 nm).

Sample 1-2: An OLED was vapor deposited on a glass substrate to have the following structure of layers: ITO/NPB (75 nm)/Alq+8% Ir(1-piq)$_3$/TH-1 (10 nm)/Alq (40 nm)/MgAg (220 nm).

Sample 1-3: Same as 1-1 except the dopant was Ir(1-piq)$_2$(acac), also at 8%.

Sample 1-4: An OLED was vapor deposited on a glass substrate to have the following structure of layers: ITO/NPB (75 nm)/TH-1+8% Ir(1-piq)$_3$/TH-1(10 nm)/Alq (40 nm)/MgAg (220 nm).

Sample 1-5: An OLED was vapor deposited on a glass substrate to have the following structure of layers: ITO/NPB (75 nm)/TH-1+8% Ir(1-piq)$_2$(acac)/TH-1(10 nm)/Alq (40 nm) MgAg (220 nm).

The five samples 1-1 to 1-5 were encapsulated in a dry box. They were then operated at a constant current density of 20 mA/cm2 and the voltage and luminance properties were measured. The results are shown in Table 2.

TABLE 2

| Sample | Voltage | CIE x | CIE y | Yield(Cd/A) |
|---|---|---|---|---|
| 1-1 | 10.4 | 0.670 | 0.324 | 1.64 |
| 1-2 | 12.3 | 0.676 | 0.321 | 1.58 |
| 1-3 | 12.4 | 0.683 | 0.313 | 2.39 |
| 1-4 | 15.1 | 0.672 | 0.325 | 4.39 |
| 1-5 | 13.5 | 0.676 | 0.320 | 4.23 |

From the data presented in table 2, it is seen that host materials selected from the aluminum bis-(2-substituted)oxinoid compounds bearing a third ligand comprising an aromatic-oxy group are more suitable hosts for deep red phosphorescent dopants than Alq by comparison of the luminance yield of sample 1-4 to that of samples 1-1 or 1-2, and of sample 1-5 to that of 1-3. Without being limited by a particular theory, the relatively higher yields and high spectral purity of the red phosphorescent dopant emission were obtained because the TH-1 has a higher triplet energy than the red dopant, whereas the triplet energies of Alq and the red dopants are very close together, resulting in incomplete partitioning of triplet excitons onto the red dopants in Alq.

The samples were further tested for operational stability by operating at constant current density of 20 mA/cm$^2$ and observing the decrease in luminance over time. In this manner the luminance of sample 1-4 was found to drop by 8.4% in 300 hrs, while that of that of sample 1-5 dropped by 22.5% in the same period of time. This comparison of operational stabilities shows that the Iridium compounds having three C^N-cyclometallating ligands provide higher device operational stability than compounds having only two C^N-cyclometallating ligands and the remaining coordination sites occupied by other types of ancillary ligands, such as acetylacetonate.

Example 2 (Comparisons)

The following set of 7 samples, all comparisons, were fabricated on glass substrates with ITO having average resistivity of 60 ohms/sq.

Sample 2-1: ITO/NPB (115 nm)/(Alq+8% Ir(1-piq)$_3$ (35 nm)/Alq(50 nm)/MgAg (220 nm).
Sample 2-2: ITO/NPB (115 nm)/(Alq+15% NPB)+4% Ir(1-piq)$_3$ (35 nm)/Alq(50 nm)/MgAg (220 nm).
Sample 2-3: ITO/NPB (115 nm)/(Alq+35% NPB)+4% Ir(1-piq)$_3$ (35 nm)/Alq(50 nm)/MgAg (220 nm).
Sample 2-4: ITO/NPB (115 nm)/(Alq+50% NPB)+4% Ir(1-piq)$_3$ (35 nm)/Alq(50 nm)/MgAg (220 nm).
Sample 2-5: ITO/NPB (115 nm)/(Alq+15% NPB)+8% Ir(1-piq)$_3$ (35 nm)/Alq(50 nm)/MgAg (220 nm).
Sample 2-6: ITO/NPB (115 nm)/(Alq+35% NPB)+8% Ir(1-piq)$_3$ (35 nm)/Alq(50 nm)/MgAg (220 nm).
Sample 2-7: ITO/NPB (115 nm)/(Alq+50% NPB)+8% Ir(1-piq)$_3$ (35 nm)/Alq(50 nm)/MgAg (220 nm).

The seven samples 2-1 to 2-7 were encapsulated in a dry box. They were then operated at a constant current density of 20 mA/cm$^2$ and the voltage and luminance properties were measured. The results are shown in Table 3.

TABLE 3

| Sample | Voltage | CIE x | CIE y | Yield(Cd/A) |
|---|---|---|---|---|
| 2-1 | 10.7 | 0.677 | 0.321 | 2.40 |
| 2-2 | 9.87 | 0.668 | 0.328 | 2.50 |
| 2-3 | 9.21 | 0.663 | 0.332 | 3.61 |

TABLE 3-continued

| Sample | Voltage | CIE x | CIE y | Yield(Cd/A) |
|---|---|---|---|---|
| 2-4 | 8.73 | 0.655 | 0.338 | 3.99 |
| 2-5 | 9.64 | 0.674 | 0.324 | 3.14 |
| 2-6 | 9.16 | 0.669 | 0.328 | 4.10 |
| 2-7 | 8.57 | 0.662 | 0.332 | 4.08 |

While the results for samples 2-2 thru 2-7 having mixed hosts of Alq and NPB all show improvements over the sample 2-1 with the neat Alq as host, the luminance yields are still lacking.

Example 3

For the following set of five comparison and five invention devices, the ITO on glass substrates were had resistivity in the range 100 to 110 ohms/sq.

Comparison samples: Five different OLEDs were fabricated with the following layer structure incorporating TH-1 as the neat host for the red Ir(1-piq)$_3$ dopant: ITO/NPB (115 nm)/TH-1+ Ir(1-piq)$_3$ (35 nm)/TH-1 (10 nm)/Alq(40 nm)/MgAg (220 nm). The Ir(1-piq)$_3$ dopant concentration was varied from 1 to 10% to produce five different samples.

Invention samples: OLEDs were fabricated in the same manner as the preceding comparisons except the host for the Ir(1-piq)$_3$ dopant was a mixture formed by co-evaporating TH-1 and NPB at rates to produce a layer containing 15 weight % NPB relative to TH-1. Again the concentration of Ir(1-piq)$_3$ dopant was varied from 1 to 10% relative to the total of the mixed host materials to produce five device samples. The NPB concentration of 15% was found through prior experimentation to give near optimal luminance yield.

The five comparison and five invention samples were encapsulated in a dry box. They were then operated at a constant current density of 20 mA/cm$^2$ and the voltage and luminance properties were measured. The results are shown in Table 4.

TABLE 4

| Sample Type | Ir(1-piq)$_3$ (%) | V @ 20 mA/cm$^2$ | CIE x | CIE y | Yield (cd/A) |
|---|---|---|---|---|---|
| Comparison | 1 | 15.5 | 0.638 | 0.342 | 4.80 |
| Comparison | 2 | 15.9 | 0.655 | 0.336 | 5.08 |
| Comparison | 4 | 16.2 | 0.666 | 0.331 | 5.64 |
| Comparison | 8 | 15.3 | 0.671 | 0.327 | 6.86 |
| Comparison | 10 | 14.7 | 0.673 | 0.326 | 7.34 |
| Invention | 1 | 13.0 | 0.648 | 0.342 | 10.37 |
| Invention | 2 | 12.9 | 0.658 | 0.337 | 10.20 |
| Invention | 4 | 12.5 | 0.664 | 0.333 | 9.75 |
| Invention | 8 | 11.7 | 0.668 | 0.329 | 8.23 |
| Invention | 10 | 11.6 | 0.669 | 0.329 | 7.88 |

From the results in Table 4, it is seen that the invention devices including the co-hosts of TH-1 and 15% NPB provide higher luminance yields and lower drive voltages than the comparisons where the host is neat TH-1. It is also notable that very high luminance yields can be obtained with lower Ir(1-piq)$_3$ dopant concentrations in the devices of the invention than in the comparison devices. A small shift in color coordinates and a- further decrease in voltage are observed as the Ir(1-piq)$_3$ dopant concentration is increased. It is further notable how much higher the luminance yields are for the Invention samples relative to the comparison samples 2-1 thru 2-7 of the preceding Example 2 that contained co-hosts of Alq and NPB.

Example 4

This example employs the orange phosphorescent dopant fac-tris(3-phenyl-isoquinolinato-N^C)Iridium(III) (Ir(3-piq)$_3$, compound 2c) having a triplet energy of about 2.3 eV and further illustrates the importance to the present invention of selecting the aluminum bis-(2-substituted)oxinoid compound bearing a third ligand comprising an aromatic-oxy group based on its triplet energy relative to that of the desired phosphorescent dopant.

Sample 4-1: An OLED was fabricated with the following layer structure: ITO/NPB (115 nm)/(TH-1+15% NPB)+ 6% Ir(3-piq)$_3$ (35 nm)/TH-1 (10 nm)/Alq (40 nm)/MgAg (220 nm).

Sample 4-2: Same as sample 3-1 except TH-3 was used instead of TH-1.

The results are shown in Table 5.

TABLE 5

| Sample | V @ 2 mA/cm$^2$ | CIE x | CIE y | Yield (Cd/A) |
|---|---|---|---|---|
| 4-1 | 7.86 | 0.55 | 0.44 | 7.6 |
| 4-2 | 7.97 | 0.54 | 0.45 | 16.3 |

The results in table 5 show that sample 4-1 according to the invention with an aluminum oxinoid host having triplet energy (2.36 eV; see Table 1) slightly above that of the orange phosphorescent dopant (2.3 eV; estimated from electroluminescence spectrum) gives emission from said dopant with good color purity. However, sample 4-2 according to the invention with TH-3 having a greater separation between its triplet energy (2.45 eV; see Table 1) and that of the dopant gives more than twice the luminance yield.

Example 5

Sample 5-1: An OLED was fabricated with the following layer structure: ITO/NPB (115 nm)/(TH-1+15% NPB)+ 2% Ir(1-piq)$_3$ (35 nm)/TH-1 (10 nm)/Alq(40 nm)/MgAg (220 nm).

Sample 5-2: Same as sample 5-1, except about 1% by weight of lithium was co-deposited with the electron-transporting Alq material.

The samples were encapsulated in a dry box. They were then operated at a constant current density of 6 mA/cm$^2$ and the voltage and luminance properties were measured. The results are shown in Table 6.

TABLE 6

| Sample | V @ 2 mA/cm$^2$ | CIE x | CIE y | Yield (Cd/A) |
|---|---|---|---|---|
| 5-1 | 10.0 | 0.657 | 0.338 | 10.3 |
| 5-2 | 7.7 | 0.661 | 0.335 | 11.8 |

The results in Table 6 comparing samples 5-2 to 5-1, show that in the practice of the invention, that incorporation of the alkali metal dopant lithium into the electron transporting layer further decreases the drive voltage and also resulted in increased luminance yield.

Example 6

An EL device (Sample 6-1) satisfying the requirements of the invention was constructed in the following manner:
1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon ($CF_x$) hole injecting layer (HIL) by plasma-assisted deposition of $CHF_3$.
3. A hole transporting layer (HTL) of N,N'-di-1-naphthyl-N,N'-diphenyl-4,4'-diaminobiphenyl (NPB) having a thickness of 115 nm was then evaporated from a resistively heated tantalum boat.
4. A 35 nm light emitting layer (LEL) consisting of a mixture of TH-1 as the electron transporting co-host, NPB as the hole transporting co-host present at a concentration of 15 wt. % of the total of the co-host materials in the LEL, and bis(1-phenylisoquinolato-N^C-)(2-phenylpyridinato-N^C-) Iridium(III)($Ir(1-piq)_2(ppy)$) as a phosphorescent emitter at a concentration of 4 wt. % relative to the total of the co-host materials was then deposited onto the hole transporting layer. These materials were also evaporated from tantalum boats.
5. A hole blocking layer (HBL) of TH-1 having a thickness of 10 nm was then evaporated from another tantalum boat.
6. A 40 nm electron transporting layer (ETL) of tris(8-quinolinolato)aluminum (III) (Alq) was then deposited onto the hole blocking layer. This material was also evaporated from a tantalum boat.
7. On top of the Alq layer was deposited a 220 nm cathode formed of a 10:1 volume ratio of Mg and Ag.

The above sequence completed the deposition of the EL device.

Therefore, Device Sample 6-1 has the following structure of layers: ITO|$CF_x$ (1 nm)|NBP (115 nm)|(TH-1+15 wt. % NPB)+4 wt. % $Ir(1-piq)_2(ppy)$ (35 nm)|TH-1 (10 nm)|Alq (40 nm)|Mg:Ag (220 nm).

The device, together with a desiccant, was then hermetically packaged in a dry glove box for protection against ambient environment.

The cells thus formed were tested for efficiency and color at an operating current density of 20 mA/cm2 and the results are reported in Table 7 in the form of luminance yield and CIE (Commission Internationale de l'Eclairage) coordinates.

TABLE 7

Evaluation Results for EL device Sample 6-1 at 20 mA/cm$^2$.

| Sample | Luminance Yield (cd/A) | Voltage (V) | CIE x | CIE y |
|---|---|---|---|---|
| 6-1 | 9.33 | 12.4 | 0.660 | 0.337 |

Example 7

An EL device (Sample 7-1) satisfying the requirements of the invention was constructed in the following manner:
1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon ($CF_x$) hole injecting layer (HIL) by plasma-assisted deposition of $CHF_3$.
3. A hole transporting layer (HTL) of N,N'-di-1-naphthyl-N,N'-diphenyl-4,4'-diaminobiphenyl (NPB) having a thickness of 115 nm was then evaporated from a resistively heated tantalum boat.
4. A 35 nm light emitting layer (LEL) consisting of a mixture of TH-6 as the electron transporting co-host, NPB as the hole transporting co-host present at a concentration of 15 wt. % of the total of the co-host materials in the LEL, and $Ir(1-piq)_3$ (Compound 2b) as a phosphorescent emitter at a concentration of 4 wt. % relative to the total of the co-host materials was then deposited onto the hole transporting layer. These materials were also evaporated from tantalum boats.
5. A hole blocking layer (HBL) of TH-6 having a thickness of 10 nm was then evaporated from another tantalum boat.
6. A 40 nm electron transporting layer (ETL) of tris(8-quinolinolato)aluminum (III) (Alq) was then deposited onto the hole blocking layer. This material was also evaporated from a tantalum boat.
7. On top of the Alq layer was deposited a 220 nm cathode formed of a 10:1 volume ratio of Mg and Ag.

The above sequence completed the deposition of the EL device.

Therefore, Device Sample 7-1 has the following structure of layers: ITO|$CF_x$(1 nm)|NBP (115 nm)|(TH-6+15 wt. % NPB)+4 wt. % $Ir(1-piq)_3$ (35 nm)|TH-6 (10 nm)|Alq (40 nm)|Mg:Ag (220 nm).

The device, together with a desiccant, was then hermetically packaged in a dry glove box for protection against ambient environment.

The cells thus formed were tested for efficiency and color at an operating current density of 20 mA/cm$^2$ and the results are reported in Table 8 in the form of luminance yield and CIE (Commission Internationale de l'Eclairage) coordinates.

TABLE 8

Evaluation Results for EL device Sample 7-1 at 20 mA/cm$^2$.

| Sample | Luminance Yield (cd/A) | Voltage (V) | CIE x | CIE y |
|---|---|---|---|---|
| 7-1 | 7.30 | 12.4 | 0.660 | 0.335 |

The entire contents of the patent materials and publications referred to in this specification are incorporated herein by reference. The invention has been described in detail with particular reference to certain preferred embodiments thereof, but it will be understood that variations and modifications can be effected within the spirit and scope of the invention.

| PARTS LIST | |
|---|---|
| 101 | Substrate |
| 103 | Anode |
| 105 | Hole-Injecting layer (HIL) |
| 107 | Hole-Transporting layer (HTL) |
| 109 | Light-Emitting layer (LEL) |

-continued

| PARTS LIST | |
|---|---|
| 110 | Hole-blocking layer (HBL) |
| 111 | Electron-Transporting layer (ETL) |
| 113 | Cathode |

The invention claimed is:

1. An organic light emitting device containing a cathode, an anode, and having located there-between a light emitting layer, comprising:
A) co-hosts including
  a) a hole transporting compound, and
  b) an aluminum chelate according to the following formula

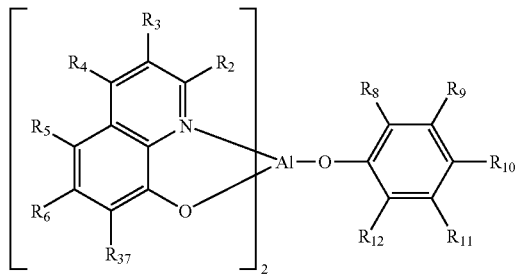

wherein:
$R_2$ represents an electron donating group,
$R_3$ and $R_4$ each independently represent hydrogen or an electron donating group,
$R_5$, $R_6$, and $R_7$ each independently represent hydrogen or an electron accepting group, and
$R_8$, $R_9$, $R_{10}$, $R_{11}$, and $R_{12}$ collectively contain 18 or fewer carbon atoms and each independently represent hydrogen or substituent groups containing from 1 to 12 carbon atoms, with the proviso that $R_8$ and $R_9$ may join together to form a fused ring and with the proviso that $R_9$ and $R_{10}$ may join to form a fused ring; and
B) at least one light emitting Iridium compound, wherein the Iridium compound is a tris C^N-cyclometallated complex; and
wherein the triplet energies of the hole transporting and aluminum chelate co-host materials are each at least about 0.1 eV greater than that of the tris C^N-cyclometallated iridium complex.

2. An organic light emitting device as in claim 1 wherein $R_2$ is chosen from the group consisting of —R', —OR', and —NR'(R") wherein R' is a hydrocarbon containing up to 6 carbon atoms and R" is hydrogen or R'.

3. An organic light emitting device as in claim 1 wherein $R_2$ is a methyl group.

4. An organic light emitting device as in claim 1 wherein $R_3$ and $R_4$ are independently chosen from the group consisting of hydrogen, —R', —OR', and —NR'(R") where R' is a hydrocarbon containing up to 6 carbon atoms and R" is hydrogen or R'.

5. An organic light emitting device as in claim 1 wherein $R_2$ is a methyl group and $R_4$ is chosen from the group consisting of —R', —OR', and —NR'(R") where R' is a hydrocarbon containing up to 6 carbon atoms and R" is hydrogen or R'.

6. An organic light emitting device as in claim 1 wherein $R_2$ and $R_4$ are each methyl groups.

7. An organic light emitting device as in claim 1 wherein $R_5$, $R_6$, and $R_7$ each independently represent hydrogen or an electron accepting group independently chosen from the group consisting of cyano, α-haloalkyl, α-haloalkoxy, amido, sulfonyl, carbonyl, carbonyloxy and oxycarbonyl substituents containing up to 10 carbon atoms.

8. An organic light emitting device as in claim 1 wherein $R_5$, $R_6$, and $R_7$ each independently represent hydrogen or a trifluoromethyl group.

9. An organic light emitting device as in claim 1 wherein the substituent groups include an aliphatic group containing 1 to 10 carbon atoms.

10. An organic light emitting device as in claim 9 wherein the aliphatic groups are methyl or tertiary butyl groups.

11. An organic light emitting device as in claim 1 wherein the substituent groups include an aromatic group containing 1 to 12 carbon atoms.

12. An organic light emitting device as in claim 11 wherein the aromatic group is a phenyl group.

13. An organic light emitting device as in claim 12 wherein the phenyl groups are further substituted with aliphatic groups or aromatic groups.

14. An organic light emitting device as in claim 1 wherein $R_8$ and $R_9$ join to form a fused benzo ring.

15. An organic light emitting device as in claim 1 wherein $R_9$ and $R_{10}$ join to form a fused benzo ring.

16. An organic light emitting device according to claim 1 wherein the hole transporting compound is a triarylamine with a triplet energy at least about 0.1 eV greater than that of the phosphorescent tris C^N-cyclometallated iridium complex.

17. An organic light emitting device according to claim 16 wherein the triarylamine is selected from benzidine based triarylamines.

18. An organic light emitting device according to claim 16 wherein the hole transporting compound is selected from 4,4'-Bis[N(1-naphthyl)-N-phenylamino]biphenyl; 4,4'-Bis[N-(1-naphthyl)-N-(2-naphthyl)amino]biphenyl; and 4,4'-Bis[N-(3-methylphenyl)-N-phenylamino]biphenyl.

19. An organic light emitting device according to claim 1 wherein the hole transporting compound is an azole.

20. An organic light emitting device according to claim 19 wherein the azole is selected from 4,4'-bis(carbazol-9-yl)biphenyl; 4,4'-bis(carbazol-9-yl)-2,2'-dimethyl-biphenyl; 1,3-bis(carbazol-9-yl)benzene; and 4,4',4"-Tris(carbazol-9-yl)triphenylamine.

21. An organic light emitting device according to claim 1 wherein the hole transporting co-host is present in a concentration from 10 to 60 weight per cent of the aluminum chelate co-host.

22. An organic light emitting device according to claim 1 where the hole transporting co-host is present in a concentration from 10 to 30 weight per cent of the aluminum chelate co-host.

23. An organic light emitting device according to claim 1 wherein the triplet energies of the hole transporting and aluminum chelate co-host materials are each at least about 0.15 eV greater than that of the tris C^N-cyclometallated iridium complex.

24. An organic light emitting device according to claim 1 where the tris C^N-cyclometallated iridium complex is present in a concentration from 1 to 10 weight per cent of the combined co-host materials.

25. An organic light emitting device according to claim 1 where the tris C^N-cyclometallated iridium complex is present in a concentration from 1 to 5 weight per cent of the combined co-host materials.

26. An organic light emitting device according to claim 1 where the tris C^N-cyclometallated iridium complex emits light in the orange to red spectral regions.

27. An organic light emitting device according to claim 1 where the tris C^N-cyclometallated iridium complex is selected from the group including C^N Iridium complexes with substituted or unsubstituted 2-phenyl-quinolines, 1-phenyl-isoquinolines, and 3-phenyl-isoquinolines.

28. An organic light emitting device according to claim 1 where the tris C^N-cyclometallated iridium complex is fac-tris(1-phenyl-isoquinolinato-N^C-)Iridium(III).

29. An organic light emitting device according to claim 1 where the tris C^N-cyclometallated iridium complex is fac-tris(3-phenyl-isoquinolinato-N^C-)Iridium(III).

30. An organic light emitting device according to claim 1 where the tris C^N-cyclometallated iridium complex is fac-tris(2-phenyl-quinolinato-N^C-)Iridium(III).

31. An organic light emitting device according to claim 1 including more than one tris C^N-cyclometallated iridium complex where each has a triplet energy less than those of each of the co-hosts.

32. An organic light emitting device according to claim 1 including a hole transporting layer between the anode and the light emitting layer.

33. An organic light emitting device according to claim 32 wherein the hole transporting layer includes one or more hole transporting compounds, which may be the same or different from the hole transporting compound in the light emitting layer.

34. An organic light emitting device according to claim 32 wherein the hole transporting layer includes a triarylamine compound.

35. An organic light emitting device according to claim 34 wherein the triarylamine is selected from benzidine based triarylamines.

36. An organic light emitting device according to claim 32 wherein the hole transporting layer includes a compound selected from 4,4'-Bis[N-(1-naphthyl)-N-phenylamino]biphenyl, 4,4'-Bis[N-(1-naphthyl)-N-(2-naphthyl)amino]biphenyl, and 4,4'-Bis[N-(3-methylphenyl)-N-phenylamino]biphenyl.

37. An organic light emitting device according to claim 32 wherein the hole transporting layer includes an azole.

38. An organic light emitting device according to claim 37 wherein the azole is selected from 4,4'-bis(carbazol-9-yl)biphenyl (CBP); 4,4'-bis(carbazol-9-yl)-2,2'-dimethyl-biphenyl (CDBP); 1,3-bis(carbazol-9-yl) benzene (mCP); and 4,4',4"-Tris(carbazol-9-yl)triphenylamine (TCTA).

39. An organic light emitting device according to claim 1 including an electron transporting layer between the light emitting layer and the cathode.

40. An organic light emitting device according to claim 39 wherein the electron transporting layer includes one or more electron transporting compounds, which may be the same or different from the electron transporting compound in the light emitting layer.

41. An organic light emitting device according to claim 39 wherein the electron transporting layer includes an aluminum chelate compound that may be the same or different from the aluminum chelate in the light emitting layer.

42. An organic light emitting device according to claim 39 wherein the electron transporting layer includes an aluminum chelate compound and the device further comprises a hole blocking layer adjacent the light emitting layer on the cathode side that contains the same aluminum compound as that in the light emitting layer.

43. An organic light emitting device according to claim 42 wherein the aluminum chelate compound in the electron transporting layer is tris(8-quinolinolato)aluminum(III).

44. An organic light emitting device according to claim 39 wherein the electron transporting layer includes 2, 2',2"-(1,3,5-phenylene)tris[1-phenyl-1H-benzimidazole].

45. An organic light emitting device according to claim 39 wherein the electron transporting layer is doped with an alkali metal dopant.

46. An organic light emitting device according to claim 45 wherein the electron transporting layer is doped with lithium.

47. An organic light emitting device according to claim 1 wherein the three C^N-cyclometallating ligands of the light emitting tris-C^N-cyclometallated Iridium complex are not all the same.

48. An organic light emitting device according to claim 1 wherein the light emitting tris-C^N-cyclometallated Iridium complex is selected from the group consisting of bis(1-phenylisoquinolinato-N^C-)(2-phenylpyridinato-N^C-)Iridium (III), bis((2-phenylpyridinato-N^C-)(1-phenylisoquinolinato-N^C-)Iridium(III), bis(1-phenylisoquinolinato-N^C-)(2-phenyl-5-methyl-pyridinato-N^C-)Iridium(III), bis(1-phenylisoquinolinato-N^C-)(2-phenyl-4-methyl-pyridinato-N^C-)Iridium(III), and bis(1-phenylisoquinolinato-N^C-)(2-phenyl-3-methyl-pyridinato-N^C-)Iridium(III).

\* \* \* \* \*